United States Patent [19]
Lai

[11] Patent Number: 5,466,169
[45] Date of Patent: Nov. 14, 1995

[54] ZERO INSERTION FORCE SOCKET

[76] Inventor: Kuang-Chih Lai, No. 2, Lane 10, Sheng-Li Street, Tu-Cheng, Taiwan

[21] Appl. No.: 285,151

[22] Filed: Aug. 3, 1994

[51] Int. Cl.⁶ .................................................. H01R 13/62
[52] U.S. Cl. ........................................ 439/264; 439/259
[58] Field of Search ................................ 439/342, 259, 439/261, 262, 263, 264, 265, 266, 268–270, 330, 331, 682, 842, 851–855

[56] References Cited

U.S. PATENT DOCUMENTS

| | | | |
|---|---|---|---|
| 4,343,524 | 8/1982 | Bright et al. | 439/268 |
| 5,342,213 | 8/1994 | Kobayashi | 439/259 |
| 5,342,214 | 8/1994 | Hsu | 439/259 |

*Primary Examiner*—Gary F. Pauman
*Assistant Examiner*—Hien D. Vu
*Attorney, Agent, or Firm*—Morton J. Rosenberg; David I. Klein

[57] ABSTRACT

An improved zero insertion force socket suitable for engaging with terminals of an integrated circuit such as a CPU of a personal computer. The terminals are permitted to be inserted into and withdrawn from the socket with very little or even zero insertion and withdrawal force. The socket includes multiple contacts and multiple insertion holes each of which has a relatively wide first insertion space for receiving the contacts and a relatively narrow second insertion space for receiving the terminals. Two locating walls are formed at an adjoining portion between the first and second insertion spaces and the each contact has an elastic engaging portion formed with two stopping portions, whereby when the contact is inserted into the first insertion space, the two stopping portion abut against the two locating walls to bias and pre-load the elastic engaging portion of the contact and accurately locate the same at its true position. Therefore, when the terminal is inserted into the second insertion space and urged to move toward the pre-loaded elastic engaging portion, the same accurately exerts a greater contacting pressure on the terminal so as to achieve a better contact relationship between the contact and the terminal.

4 Claims, 18 Drawing Sheets

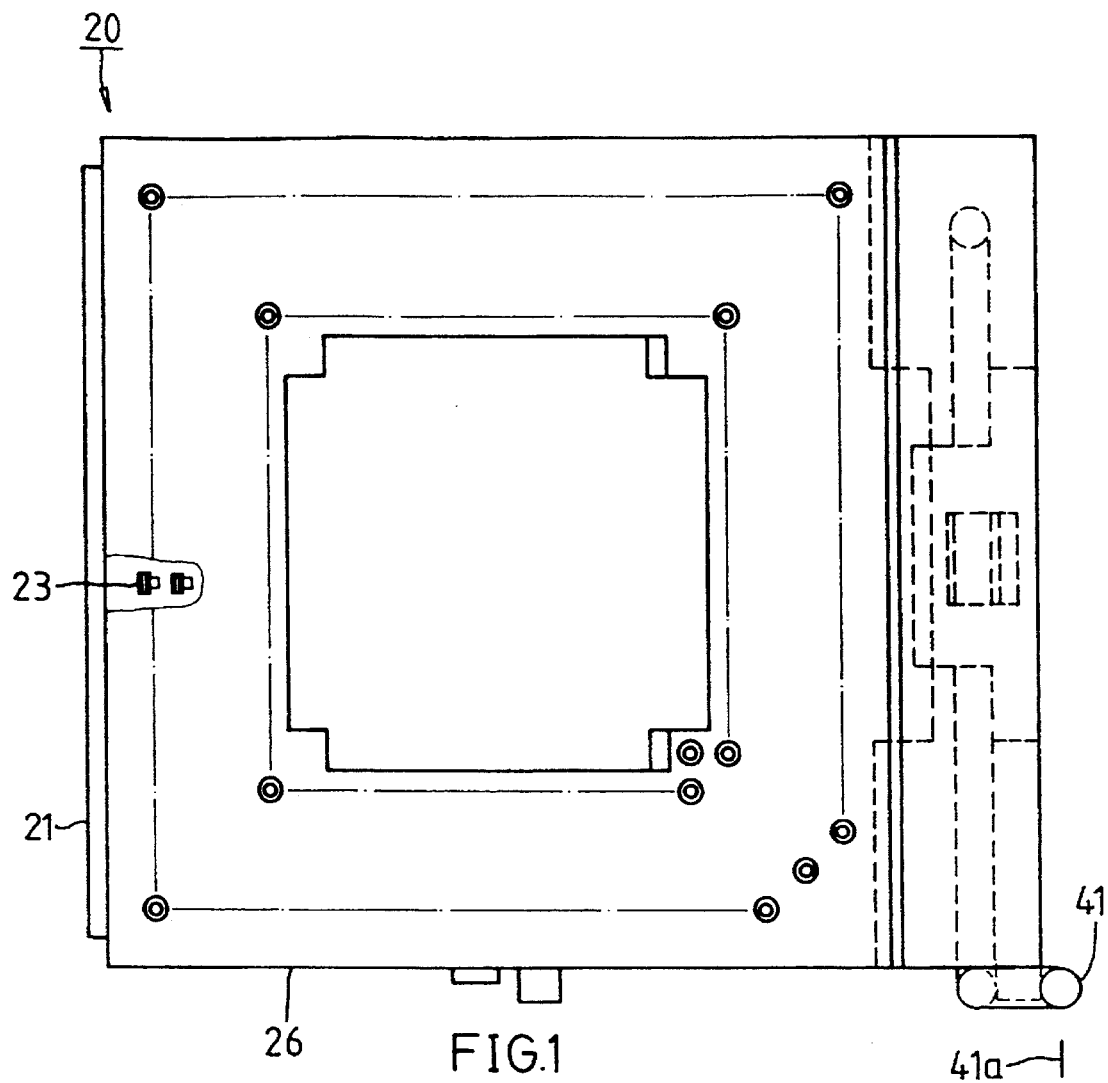
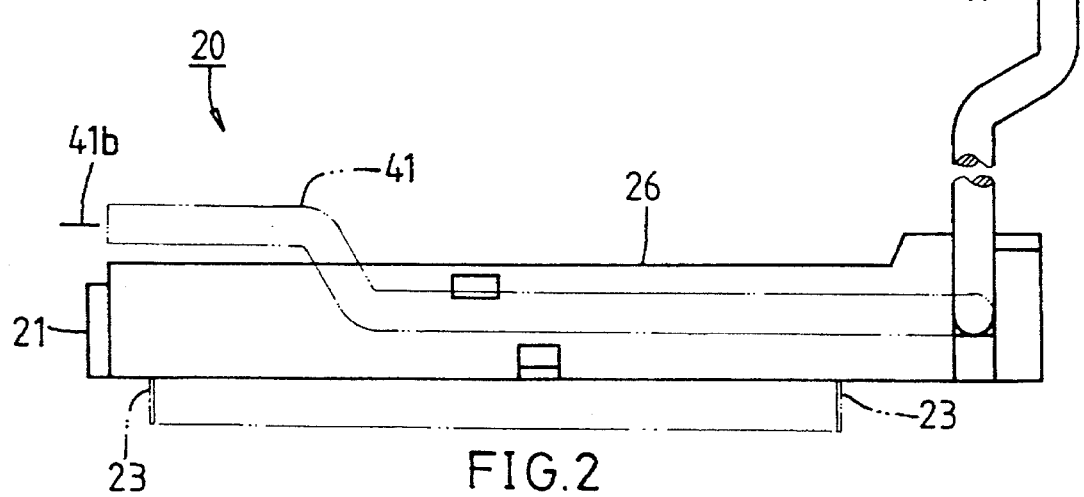

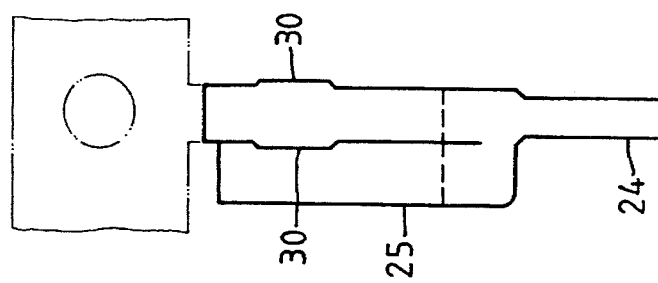
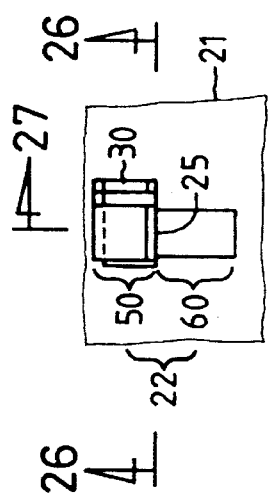
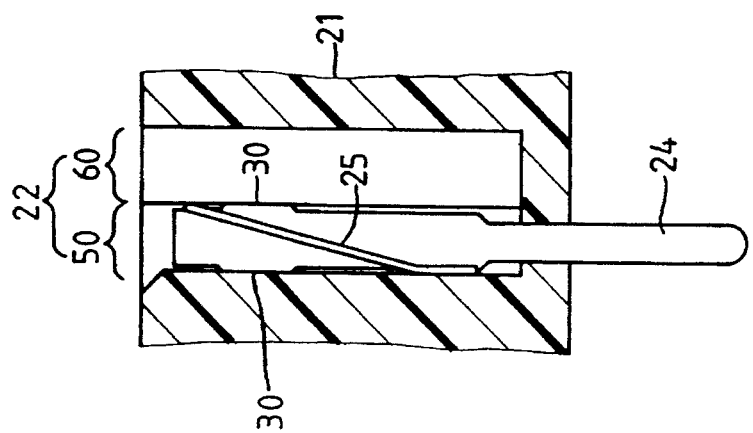

ZERO INSERTION FORCE SOCKET

BACKGROUND OF THE INVENTION

1. Field of the Invention

The present invention relates to an electrically conductive socket, and more particularly to a zero insertion force socket used for engaging with terminals of a CPU of a personal computer, in which the contacts of the socket more reliably contact with the terminals.

2. Brief Description of the Prior Art

Various kinds of zero insertion force sockets have been developed, whereby terminals of a CPU of a personal computer can be inserted into and withdrawn from such sockets without insertion and withdrawal force. This facilitates necessary change or replacement of the CPU.

A widely used conventional zero insertion force socket substantially includes a socket housing having a plurality of insertion holes formed therein and a plurality of metal-made conductive contacts respectively disposed in the insertion holes. The insertion holes of the socket are receptive of multiple terminals of an integrated circuit. According to the zero insertion force arrangement, during the insertion and withdrawal of the integrated circuit in the socket, the integrated circuit will not suffer any resistant force of the contacts of the socket. After the terminals are inserted into the insertion holes, an operation lever is moved to push a movable plate disposed over the socket housing to slide through a small distance (usually 1 mm) relative to the socket housing, whereby the terminals are urged to move toward the contacts and squeeze into a space between two opposite conductive elastic plates of the contacts. Several shortcomings exist in such structure as follows:

1. Because the elastic force of the two opposite elastic plates of the contacts is hardly completely identical, it often takes place that one of the elastic plates has greater elastic force and pushes the other elastic plate away a middle position, that is, the two elastic plates cannot be located at their true positions. As a result, the terminals of the integrated circuit often cannot be smoothly forced into the space between the two elastic plates.

2. The error of manufacturing often causes that a center of the clearance between the two elastic plates is not aligned with a center of the insertion hole. This will result in that the terminals can be hardly smoothly squeezed into the space between the the elastic plates.

3. Each contact has two elastic plates so that it will consume two pitches (one pitch equals 2.54 mm and two equal 5.08 mm) of material to manufacture each contact.

4. After formed by punching, the pitch of the contact is 5.08 mm, so that when a row of contacts are together inserted into the insertion holes of the socket housing, the pitch of which is 2.54 mm, the installation procedure is only half completed, that is, one contact is inserted into one of each two insertion holes and the other of each two insertion holes is free from the contact. Therefore, the installation procedure must be performed one more time to complete the insertion operation of a complete row of contacts into the insertion holes. Therefore, the installation procedure must be performed twice. This is troublesome and will reduce the efficiency of the automatized production procedure.

5. In the case that the pitch of the punched contact is less than 5.08 mm while more than 2.54 mm, because such pitch is not equal to the standard 2.54 mm pitch, when installing the contacts into the insertion holes of the socket housing, only one contact can be inserted into one of the insertion hole each time. Accordingly, the installation efficiency will be very low.

It is therefore necessary to provide an improved zero insertion force socket to eliminate the above shortcomings. Such socket has improved contacts and insertion holes which can accurately locate the elastic engaging portions of the respective contacts at their true positions so that the terminals of the integrated circuit can be easily and smoothly inserted into the insertions holes of the socket.

SUMMARY OF THE INVENTION

It is therefore a primary object of the present invention to provide an improved zero insertion force socket. The socket comprises a socket housing, a movable plate and multiple contacts. The housing has multiple insertion holes each of which includes a first insertion space and a second insertion space. The first insertion space has a front wall, a first and a second locating walls lying on a common plane opposite to the front wall while separating from each other, a first side walls one side of which adjoins one side of the front wall and the other side of which adjoins one side of the first locating wall, and a second side wall one side of which adjoins the other side of the front wall and the other side of which adjoins one side of the second locating wall.

The second insertion space is adjacent to and communicated with the first insertion space through an opening defined between the first and second locating walls. The second insertion space having a back wall opposite to the front wall, a third side wall one side of which adjoins the other side of the first locating wall while the other side of which adjoins one side of the back wall, and fourth side wall one side of which adjoins the other side of the second locating wall while the other side of which adjoins the other side of the back wall.

The movable plate has multiple through holes corresponding to the insertion holes of the housing respectively. The movable plate is disposed over the housing and slidable along a surface of the housing in specified directions between a released position and a locked position.

The multiple contacts are installed in the insertion holes of the housing respectively. Each of the contacts including an insertion leg and an elastic engaging portion extending from the insertion leg. On two sides of a free end of the elastic engaging portion is formed two stopping portions. A width of the elastic engaging portion at the stopping portions is larger than a width of the opening while smaller than a distance between the first and second side walls, whereby the two stopping portions are adapted to abut against the first and second locating walls respectively and in a free state. A normal distance between the free end of the elastic engaging portion and the insertion leg is larger than a distance between the front wall of the first insertion space and the opening so that after the contact is inserted into the first insertion space, the elastic engaging portion is biased against as well as pre-loaded and accurately located by the first and second locating walls of the first insertion space so as to accurately exert a sufficient contacting pressure on a terminal inserted in the second insertion space and moved toward the first insertion space.

The elastic engaging portion of the contact integrally extends from an upper end portion of the insertion leg of the contact or integrally extends from a lateral side thereof.

The elastic engaging portion of the contact is formed with double layers by means of folding one integral portion of the contact. The layers of the elastic engaging portion of the contact are attached to each other or a clearance is defined between the double layers of the elastic engaging portion of the contact.

The contact further includes a lance portion which extends from the insertion leg of the contact in order to facilitate installation of the contact in the insertion hole.

The insertion leg of the contact is formed with double layers by means of folding one integral portion of the contact.

The movable plate further includes multiple pushing portions which extend downward from the movable plate into the insertion holes of the housing and abut against one side of the terminal so as to move along with the terminal toward the elastic engaging portion of the contact and support the terminal against the contacting pressure exerted by the elastic engaging portion on the other side of the terminal.

According to the above arrangements, before the contacts are inserted into the insertion holes, the normal width between elastic engaging portions of the contacts and the insertion legs thereof is larger than the length of the first insertion spaces. Therefore, once the contacts are inserted into the first insertion spaces, the elastic engaging portions are pre-loaded. Accordingly, once the terminals are inserted into the second insertion spaces and contact with the elastic engaging portions, the elastic engaging portions will exert a greater elastic force on the terminals to achieve a better contacting effect.

Each pitch of blank strip is used to produce one contact. Therefore, half of the material for manufacturing the contacts is saved.

The contacts are manufactured at a pitch equal to that of the insertion holes of the housing, so that each row of contacts can be installed into a row of insertion holes at one time. Therefore, the installation procedure is simplified and the production efficiency is doubled.

BRIEF DESCRIPTION OF THE DRAWINGS

FIG. 1 is a partially segmented top view of the zero insertion force socket of the present invention;

FIG. 2 is a right side view according to FIG. 1;

FIG. 25 is a top view of a ninth embodiment of the contact of the present invention;

FIG. 26 is a sectional view taken along line 26—26 of FIG. 25, showing that the ninth embodiment of the contact is inserted in the housing;

FIG. 27 is a sectional view taken along line 27—27 of FIG. 25, showing that the ninth embodiment of the contact is inserted in the housing;

FIG. 28 is a front view of the ninth embodiment of the contact which is not folded and formed yet;

FIG. 34 is a sectional view taken along line 34—34 of

FIG. 33, showing that the leaf springs bound the movable plate rightward to a completely released position;

DETAILED DESCRIPTION OF THE PREFERRED EMBODIMENTS

Figure 3:
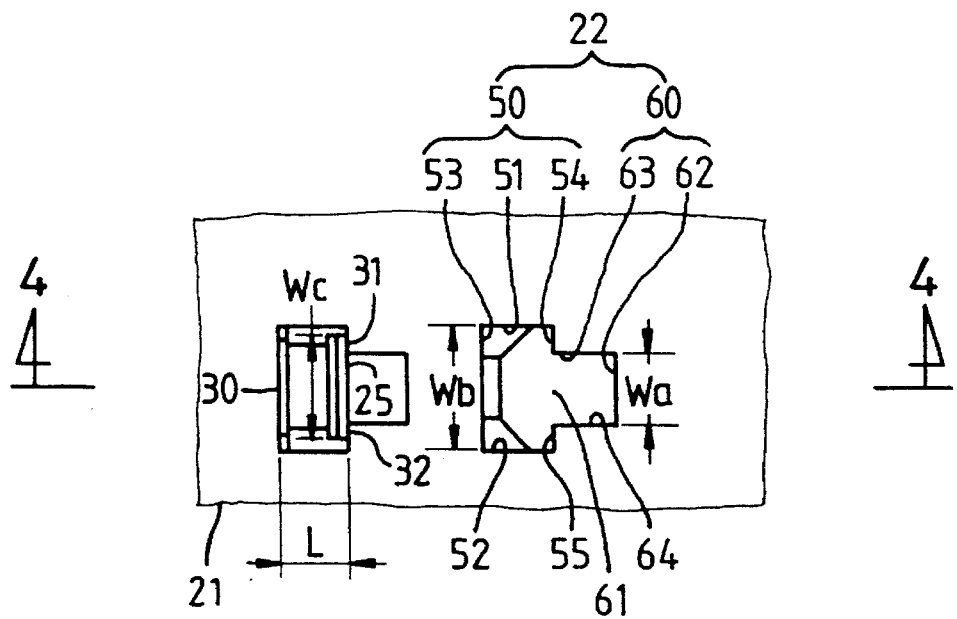
FIG. 3 is a top view showing that a first embodiment of the contact of the present invention is installed into an insertion hole of a socket housing.
Figure 4:
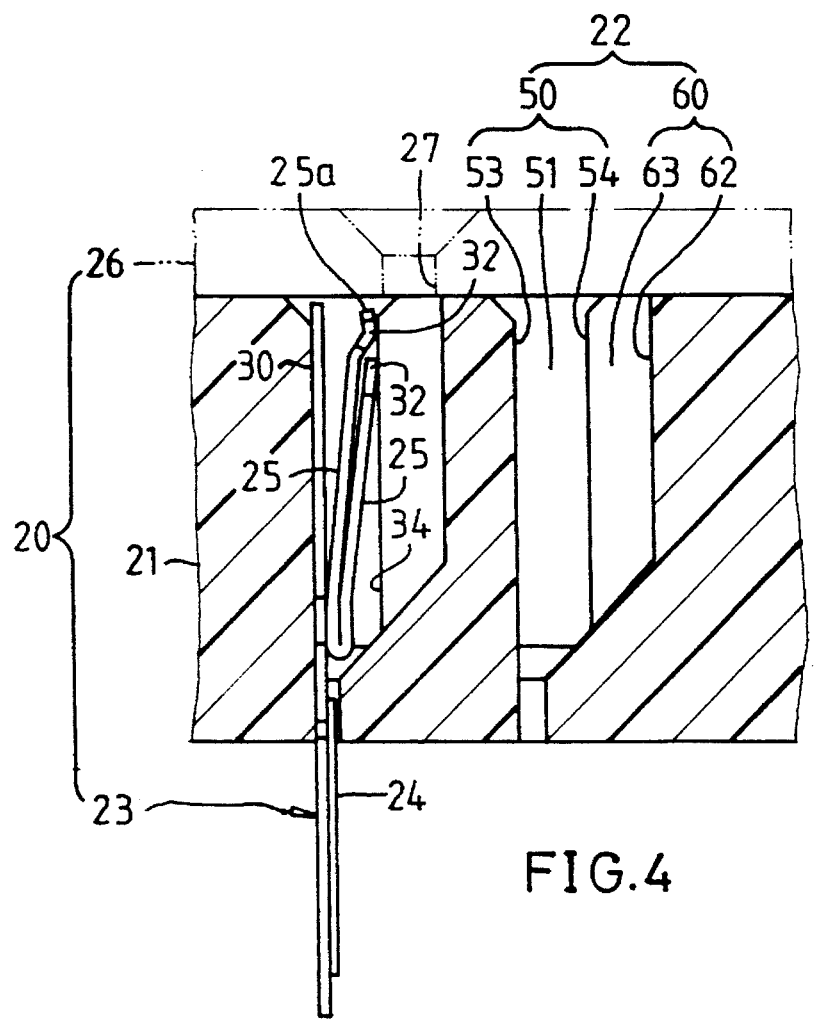
FIG. 4 is a sectional view taken along line 4—4 of FIG. 3.

Please refer to FIGS. 1 to 6. The zero insertion force socket 20 of the present invention includes an insulative housing 21, multiple contacts 23, a movable plate 26 and a metal lever 41. The housing 21 has multiple insertion holes 22 receptive of the multiple contacts 23 respectively. The movable plate 26 has multiple through holes 27 corresponding to the insertion holes 22, respectively. The movable plate 26 is disposed over the housing 21, whereby when the operation lever 41 is pivoted from a released position 41a to a locked position 41b as shown in FIG. 1, the movable plate 26 is moved to the left along a surface of the housing 21 or when the operation lever 41 is pivoted from the locked position 41b to the released position 41a, the movable plate 26 is moved to the right along the surface of the housing 21.

Each insertion hole 22 of the housing 21 includes a first insertion space 50 and a second insertion space 60. The first insertion space 50 has a front wall 53, a first and a second locating walls 54, 55 and a first and a second side walls 51, 52. The first and second locating walls 54, 55 lie in the same plane opposite to the front wall 53 while separating from each other. One side of the first side wall 51 adjoins one side of the front wall 53 and the other side of the first side wall 51 adjoins one side of the first locating wall 54. One side of the second side wall 53 adjoins the other side of the front wall 53 and the other side of the second side wall 52 adjoins one side of the second locating wall 55.

The second insertion space 60 is adjacent to and communicated with the first insertion space 50 through an opening 61 defined between the first and second locating walls 54, 55. The second insertion space 60 has a back wall 62 opposite to the front wall 53 and a third and a fourth side walls 63, 64. One side of the third side wall 63 adjoins the other side of the first locating wall 54 while the other side of the third side wall 63 adjoins one side of the back wall 62. One side of the fourth side wall 64 adjoins the other side of the second locating wall 55 while the other side of the fourth side wall 64 adjoins the other side of the back wall 62.

Figure 5:
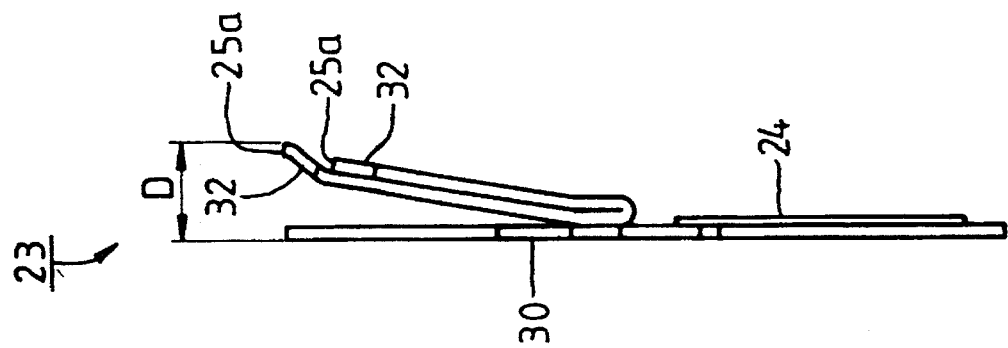
FIG. 5 is a side view of the first embodiment of the contact of the present invention.

Each contact 23 includes an insertion leg 24 and an elastic engaging portion 25 extending from the insertion leg 24. On two sides of a free end of the elastic engaging portion 25 are formed two stopping portions 31, 32. The width Wc of the elastic engaging portion 25 at the stopping portions 31, 32 is larger than the width Wa of the opening 61, while the width Wc is smaller than a distance Wb between the first and second side walls 51, 52, whereby the two stopping portions 31, 32 are adapted to abut against the first and second locating walls 54, 55, respectively. In a free state, a normal distance D between the free end of the elastic engaging portion 25 and the insertion leg 24 as shown in FIG. 5 is larger than a distance L between the front wall 53 of the first insertion space 50 and the locating walls as shown in FIG. 3. Therefore, after the contact 23 is inserted into the first insertion space 50, the elastic engaging portion 25 is biased against as well as pre-loaded and accurately located by the first and second locating walls 54, 55 of the first insertion space 50. Therefore, a terminal A of an integrated circuit B can be smoothly inserted into the second insertion space 60 without any obstacle and when the terminal A is driven by the movable plate 26 to a locked position, the pre-loaded elastic engaging portion 25 will exert sufficiently large engaging pressure on the terminal A and thus achieve a better and more reliable contact relationship therebetween.

Figure 6:
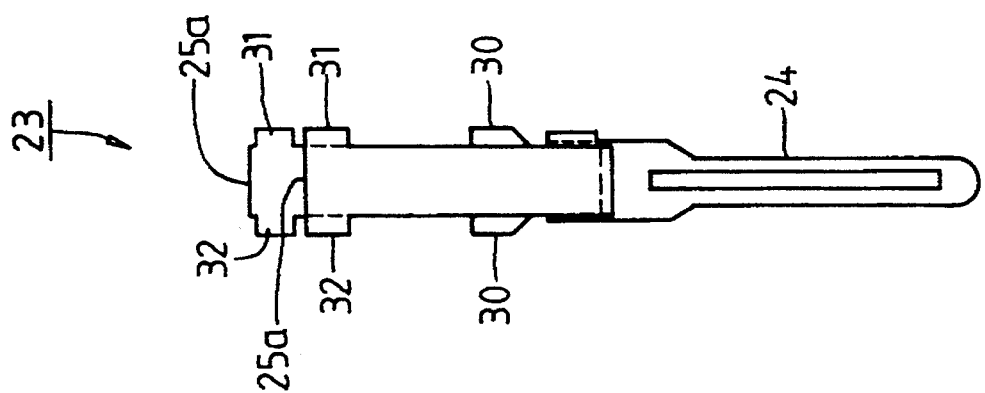
FIG. 6 is a front view according to FIG. 5.

In the first embodiment shown in FIGS. 5 and 6, the contact 23 has double layers of elastic engaging portions 25, 25 which are attached to each other in a free state.

Figure 7:
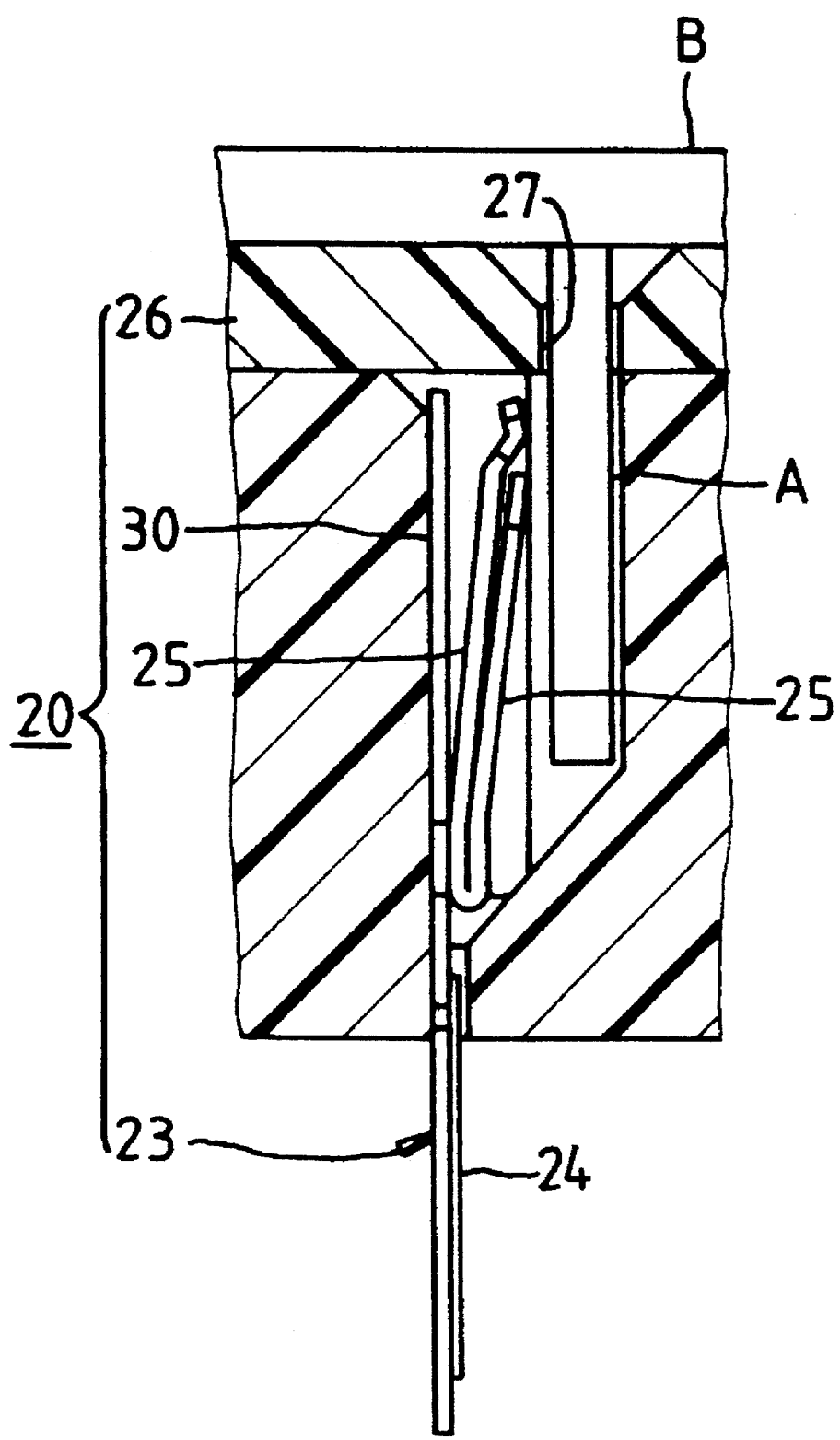
FIG. 7 is a sectional view showing that the first embodiment of the contact is inserted in a first insertion space of the insertion hole and a terminal of an integrated circuit is inserted in a second insertion space of the insertion hole while the terminal does not exert any pressure on the contact yet.
Figure 8:
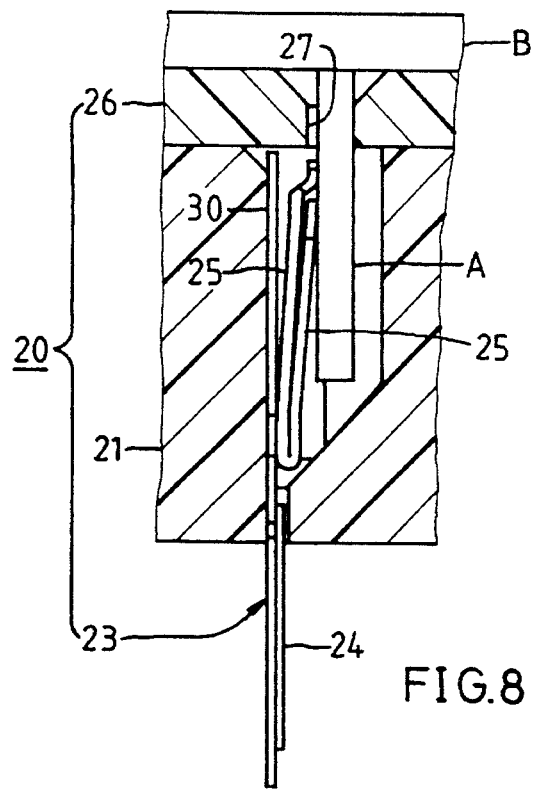
FIG. 8 is a sectional view according to FIG. 7, wherein the terminal inserted in the second insertion space is moved left to contact with the contact and exert contacting pressure thereon.

As shown in FIG. 7, when the terminal A of the integrated circuit B is inserted into the second insertion space 60 of the housing 21 and urged toward the elastic engaging portions 25, 25 as shown in FIG. 8, the free ends of the two elastic engaging portions 25, 25, which are positioned at different heights will contact with a relatively high and a relatively low portions of the terminal A respectively. As a result, the contact 23 contact s with the terminal A at more points and the elastic engaging portions 25, 25 exert more sufficient contacting pressure on the terminal A to achieve a better contacting effect.

As shown in FIGS. 1 and 2, a lance portion 30 integrally extends from an upper end of the insertion leg 24 so as to more firmly install the contact 23 in the first insertion space 50.

Figure 9:
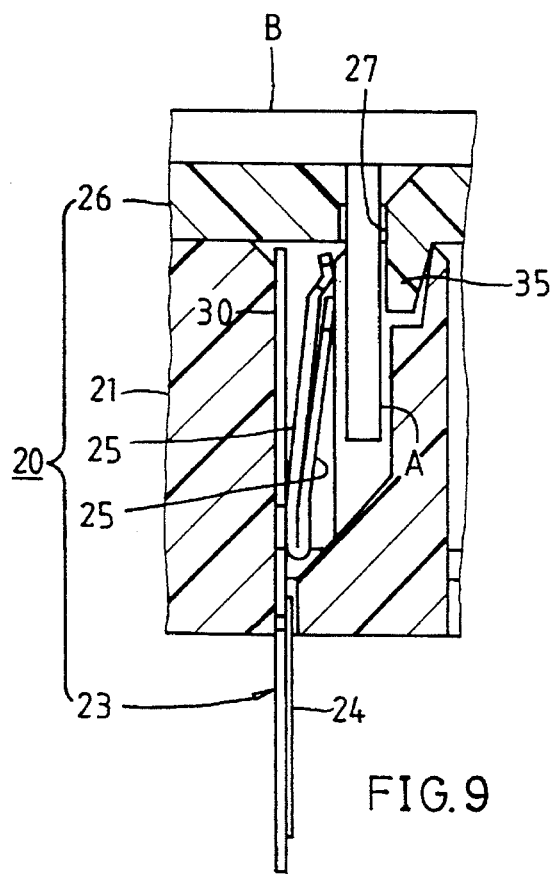
FIG. 9 is a sectional view showing that first embodiment of the contact is inserted in the first insertion space and the terminal is inserted in another embodiment of the second insertion space of the housing and the through hole of the movable plate while the terminal does not exert any pressure on the contact yet.
Figure 10:
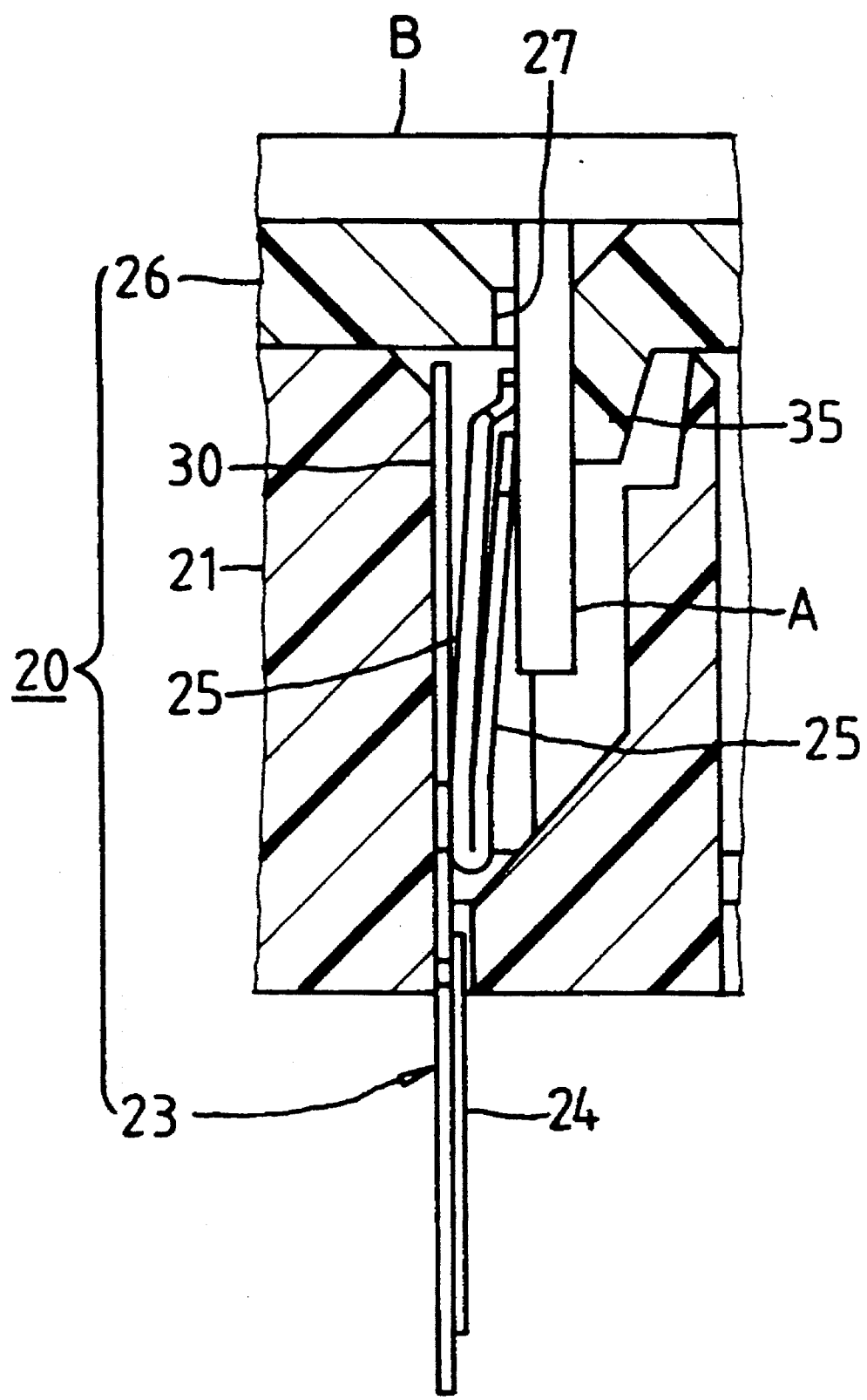
FIG. 10 is a sectional view according to FIG. 9, wherein the terminal inserted in the second insertion space is driven by the pushing portion of the movable plate to move toward the contact, contact with the contact and exert contacting pressure thereon.

Please refer to FIGS. 9 and 10, wherein the second insertion space 60 is longer and the movable plate 26 has a downward extending pushing portion 35 which extends into the second insertion space 60 and abuts against a right side of the terminal A, whereby the pushing portion 35 is adapted to support the terminal A and move along with the terminal A leftward toward the elastic engaging portions 25, 25. By means of the supporting of the pushing portion 35, the terminal A is able to suffer the greater contacting pressure from the elastic engaging portions 25, 25 without bending or distortion. The pushing portion 35 is disposed preferably on the occasion that the elastic engaging portions 25, 25 have greater elastic force or the terminal A is weaker. In the case that the elastic engaging portions 25, 25 have smaller elastic force or the terminal A is more stiff, it will be unnecessary to provide the pushing portion 35. However, the pushing portion 35 can be used in cooperation with the following embodiments of the contacts of the present invention.

Figure 12:
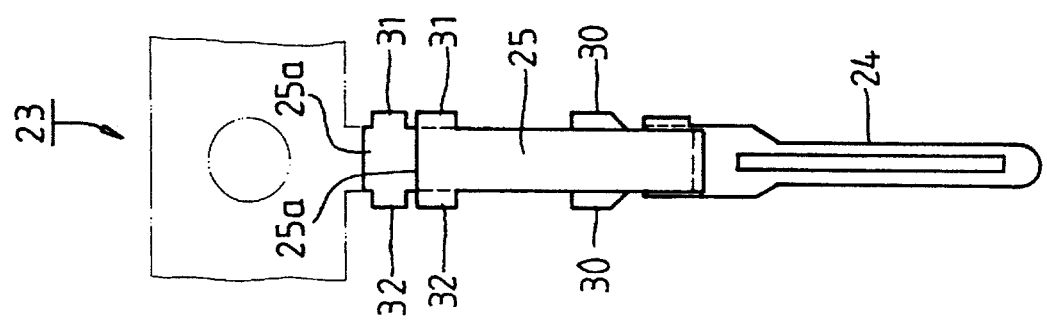
FIG. 12 is a front view according to FIG. 11.
Figure 11:
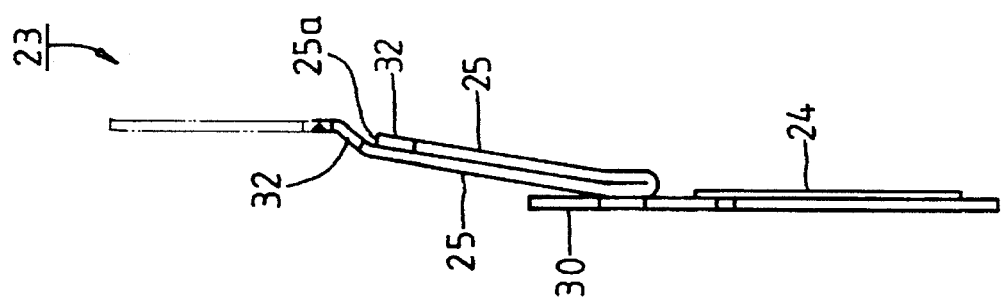
FIG. 11 is a side view of a second embodiment of the contact of the present invention.

FIGS. 11 and 12 show a second embodiment of the contact 23 of the present invention. The second embodiment is substantially similar to the first embodiment of the contact 23 shown in FIGS. 5 and 6 except that the lance portion 30 of the second embodiment is shorter than that of the first embodiment.

Figure 14:
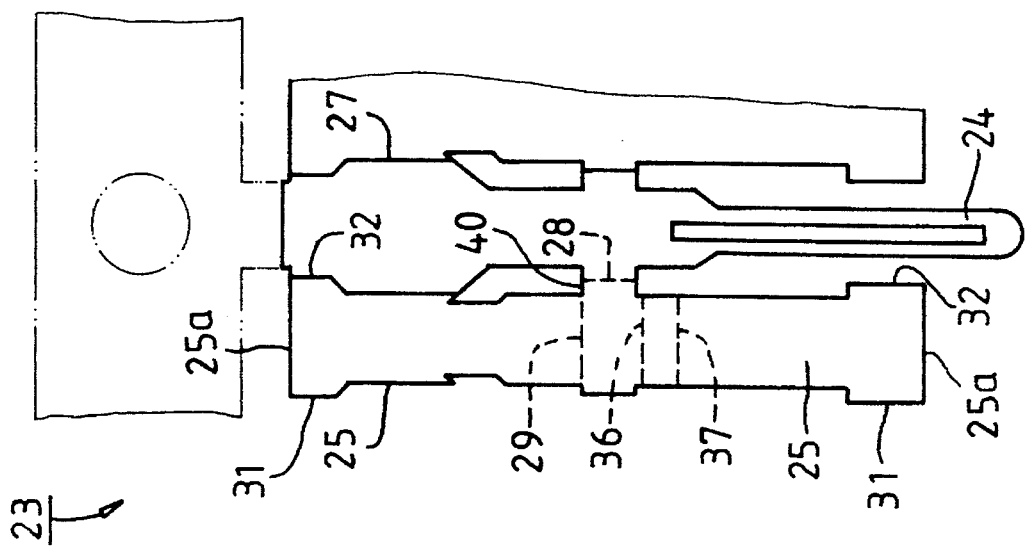
FIG. 14 is a front view of the third embodiment of the contact which is not folded and formed yet.
Figure 13:
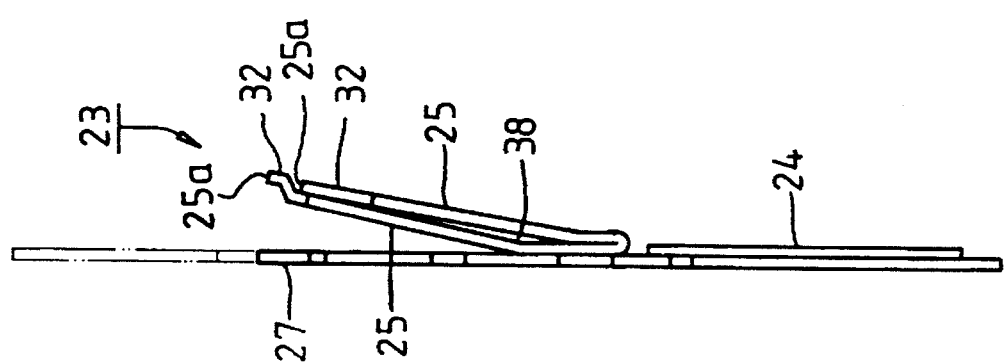
FIG. 13 is a side view of a third embodiment of the contact of the present invention.

FIGS. 13 and 14 show a third embodiment of the contact 23, wherein the free end 25a of each elastic engaging portion 25 of the contact 23 is also disposed with two stopping portions 31, 32 as previously described. The two elastic engaging portions 25 integrally extend from a folding/adjoining portion 40 integrally formed on a lateral side of the insertion leg 24. The elastic engaging portions 25, 25 are adapted to be first folded about a folding line 28 of the folding/adjoining portion 40 and then folded about three folding lines 29, 36, 37 toward each other to form the double layers of elastic engaging portions 25, 25 as shown in FIG. 13. After folded and inserted into the insertion hole 22, the free ends 25a of the double layers of elastic engaging portions 25, 25 are positioned at different heights so as to contact with a relatively high and a relatively low portions of the terminal A and thus achieve a better contacting effect.

A greatest difference between the third embodiment of the contact shown in FIGS. 13 and 14 and the first embodiment of the contact shown in FIGS. 5 and 6 resides in that according to the third embodiment, the elastic engaging portions 25, 25 are such folded that a clearance 38 is formed between the double layers of elastic engaging portions 25, 25 in a free state before installed into the insertion hole 22. In addition, the elastic engaging portions 25, 25 is otherwise cut into a different profile so that the corresponding first insertion space 50 of the housing 21 has different shape.

Figure 16:
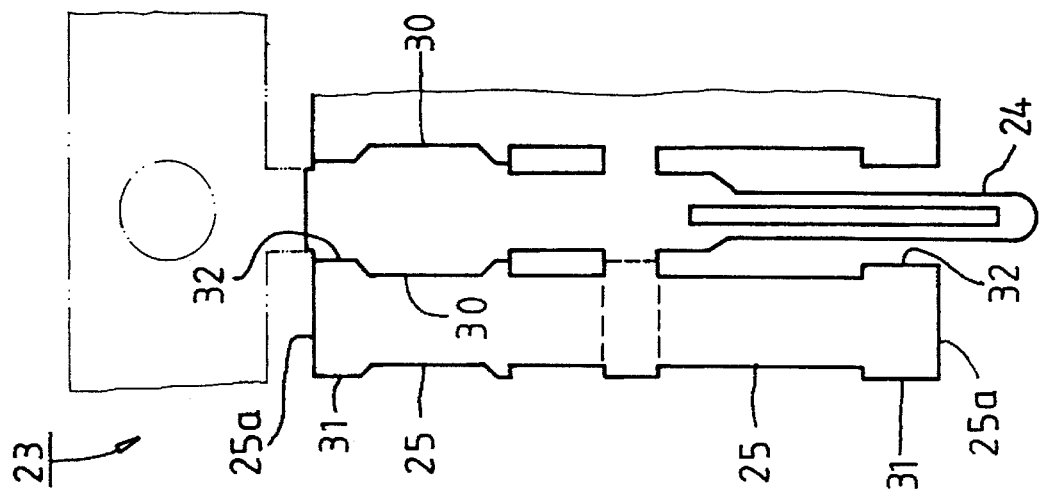
FIG. 16 is a front view of the fourth embodiment of the contact which is not folded and formed yet.
Figure 15:
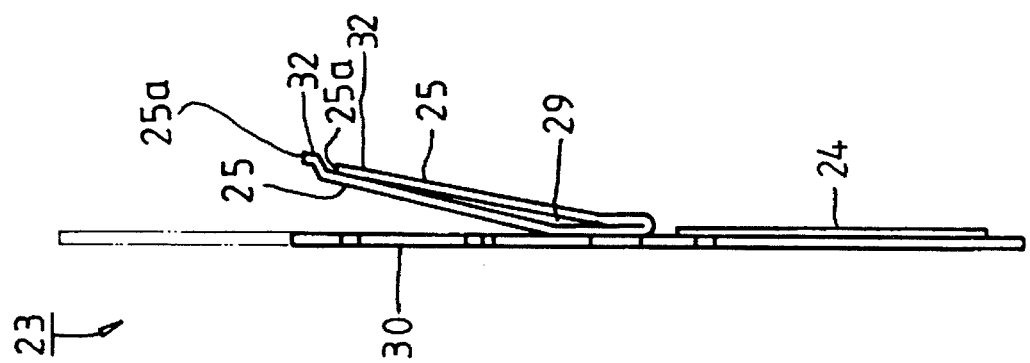
FIG. 15 is a side view of a fourth embodiment of the contact of the present invention.

FIGS. 15 and 16 show a fourth embodiment of the contact which is different from the third embodiment shown in FIGS. 13 and 14 in that the edges of the double layers of elastic engaging portions 25, 25 of these two embodiments are cut into different profiles.

Figure 18:
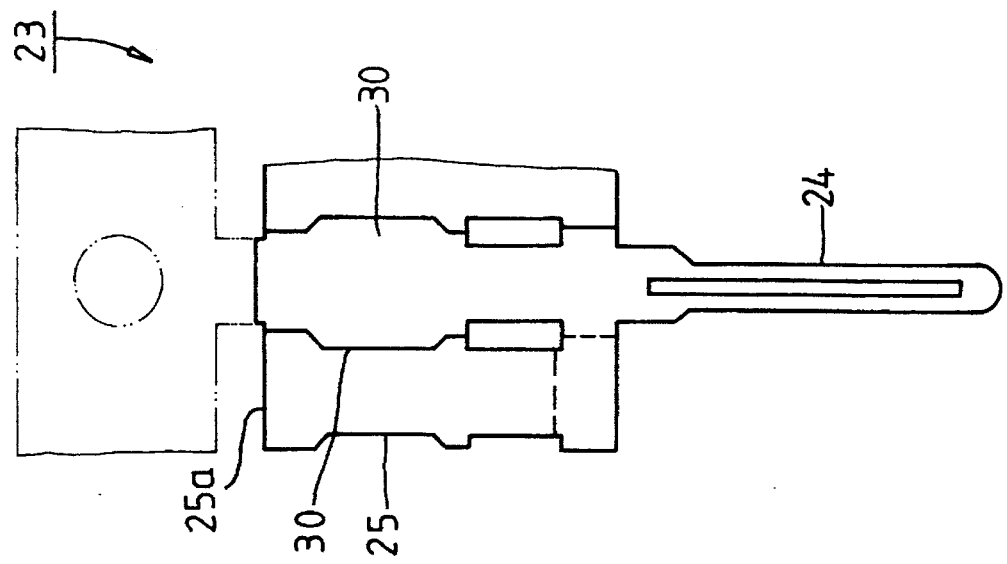
FIG. 18 is a front view of the fifth embodiment of the contact which is not folded and formed yet.
Figure 17:
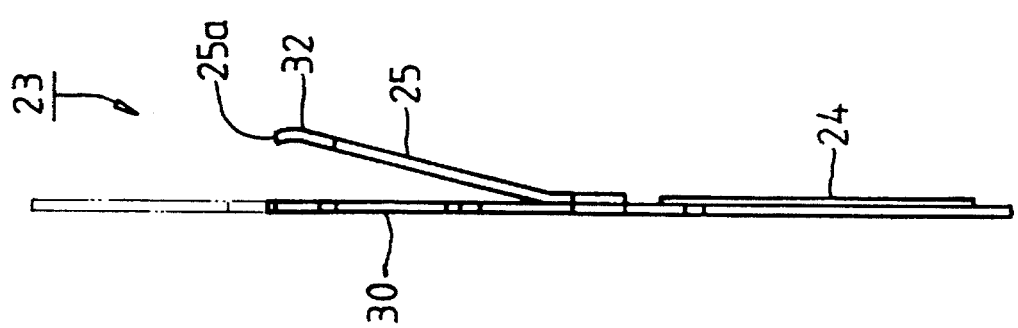
FIG. 17 is a side view of a fifth embodiment of the contact of the present invention.

FIGS. 17 and 18 show a fifth embodiment of the contact 23 which is most different from the fourth embodiment shown in FIGS. 15 and 16 in that the fifth embodiment only has one layer of elastic engaging portion 25 while the fourth embodiment has double layers of elastic engaging portions 25, 25.

Figure 20:
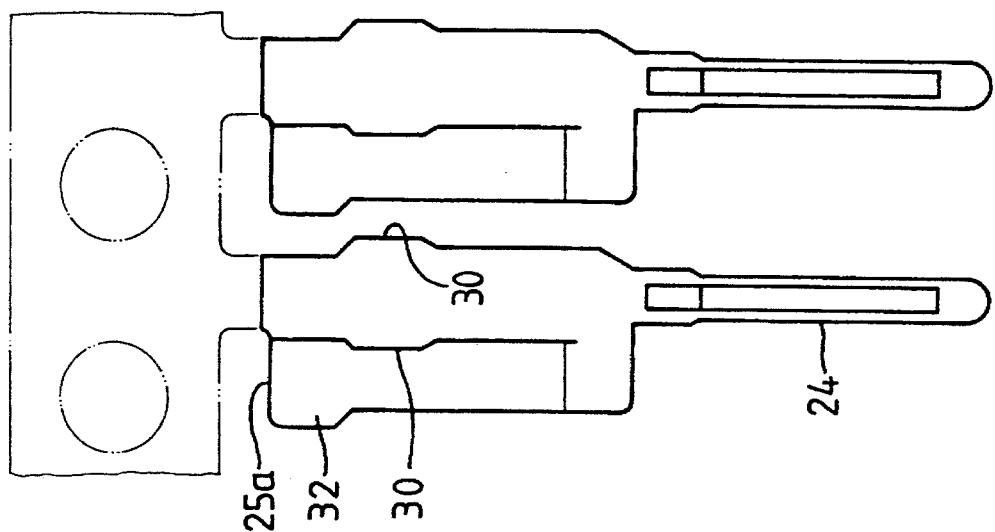
FIG. 20 is a front view of the sixth embodiment of the contact which is not folded and formed yet.
Figure 19:
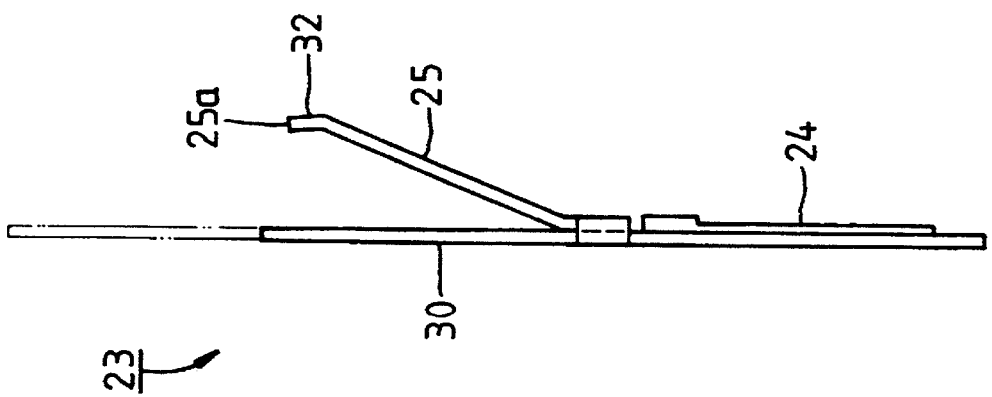
FIG. 19 is a side view of a sixth embodiment of the contact of the present invention.

FIGS. 19 and 20 show a sixth embodiment of the contact 23 which is most different from the fifth embodiment shown in FIGS. 17 and 18 in that the edges of the elastic engaging portions 25 and lance portions 30 of these two embodiments are cut into different profiles.

Figure 22:
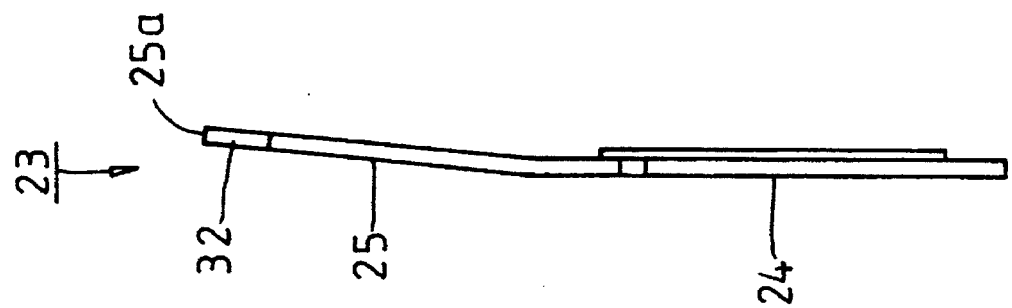
FIG. 22 is a side view of the seventh embodiment of the contact.
Figure 21:
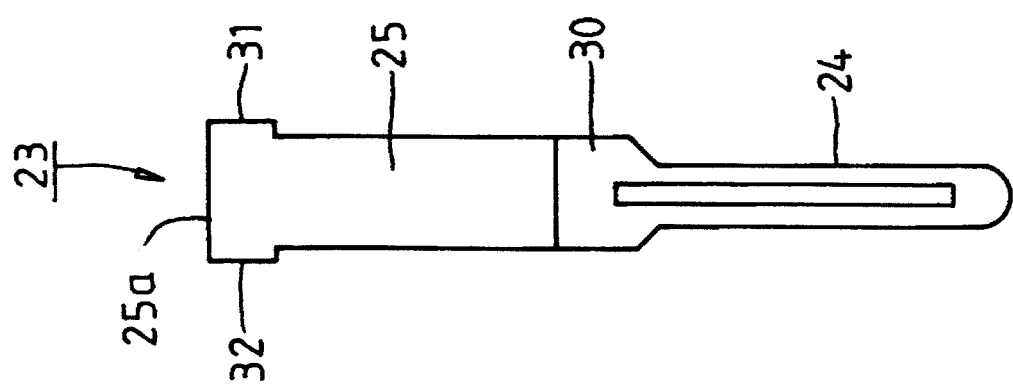
FIG. 21 is a front view of a seventh embodiment of the contact of the present invention.

FIGS. 21 and 22 show a seventh embodiment of the contact 23, wherein the lance portion 30 is disposed between the insertion leg 24 and one layer of elastic engaging portion 25.

Figure 24:
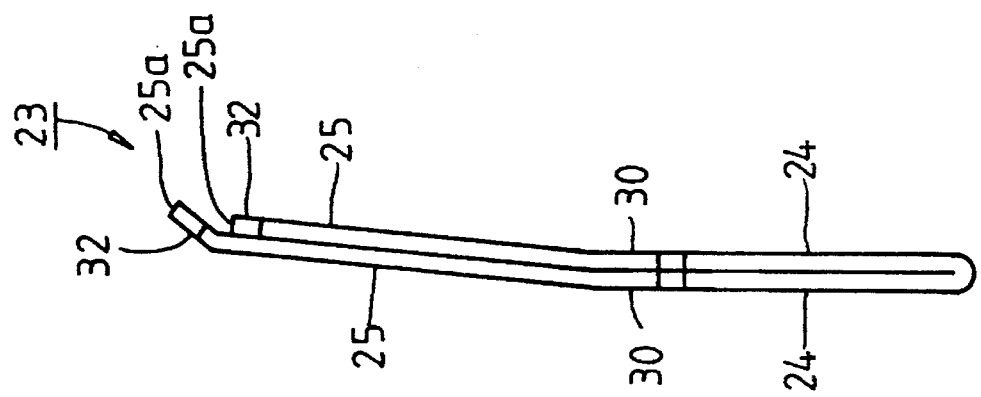
FIG. 24 is a side view of the eighth embodiment of the contact.
Figure 23:
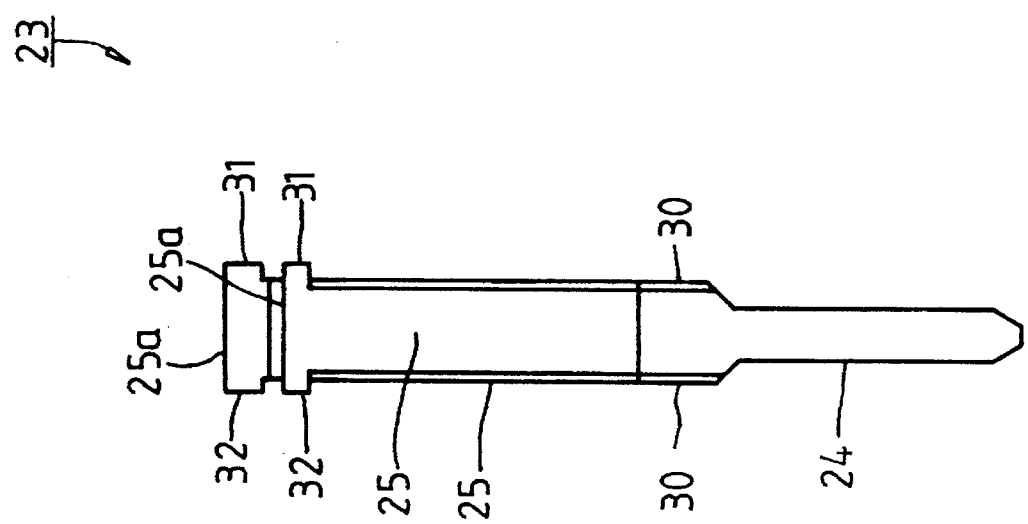
FIG. 23 is a front view of an eighth embodiment of the contact of the present invention.
Figure 29:
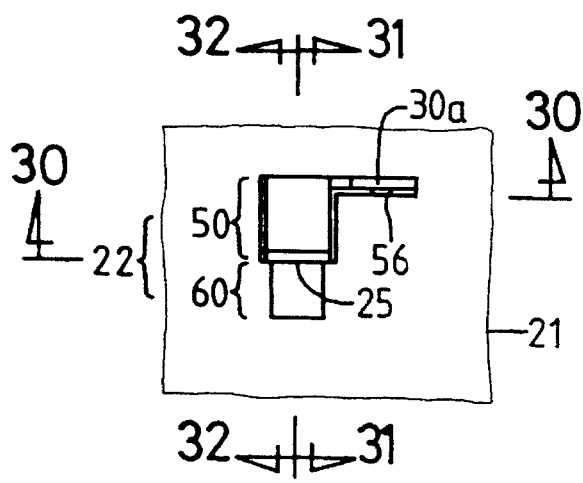
FIG. 29 is a top view of a tenth embodiment of the contact of the present invention.
Figure 31:
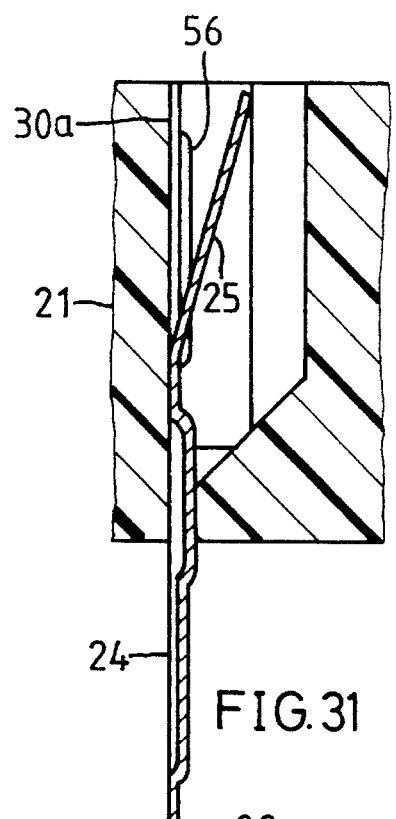
FIG. 31 is a sectional view taken along line 31—31 of FIG. 29, showing that the tenth embodiment of the contact is inserted in the housing.
Figure 30:
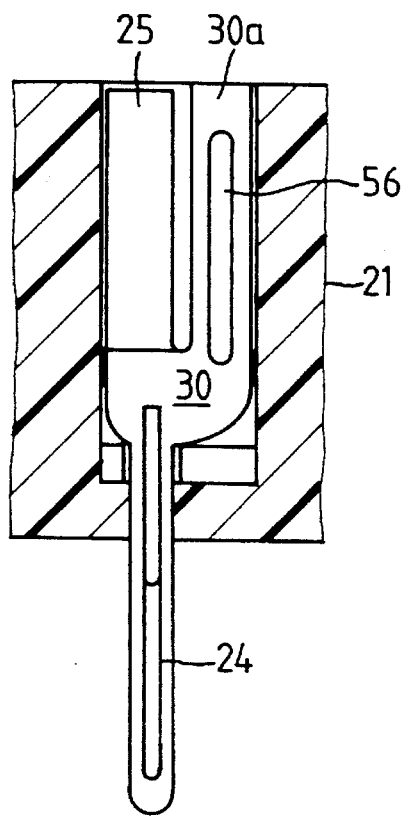
FIG. 30 is a sectional view taken along line 30—30 of FIG. 29, showing that the tenth embodiment of the contact is inserted in the housing.
Figure 32:
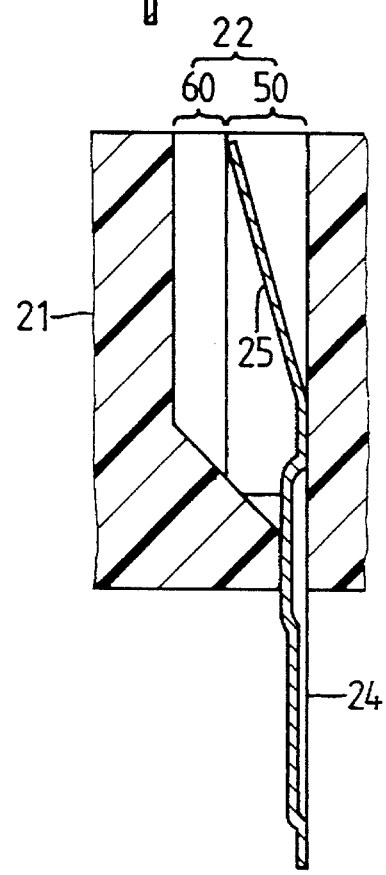
FIG. 32 is a sectional view taken along line 32—32 of FIG. 29, showing that the tenth embodiment of the contact is inserted in the housing.

FIGS. 23 and 24 show an eighth embodiment of the contact 23 which is most different from the seventh embodiment shown in FIGS. 21 and 22 in that the seventh embodiment has only one layer of insertion leg 24 and one layer of elastic engaging portion 25, while in the eighth embodiment, a single metal plate is folded to form double layers of insertion legs 24 and double layers of elastic engaging portions 25 which have greater strength and elasticity and are suitable for stronger terminals.

FIGS. 25, 26, 27 and 28 show a ninth embodiment of the contact 23, wherein the lance portion 30 and the elastic engaging portion 25 of the contact 23 contain a 90 degree angle as shown in FIG. 25. FIG. 28 shows that the contact 23 has been punched and formed while the elastic engaging portion 25 thereof has not yet folded toward the lance portion 30. Such structure has the advantage that the elastic engaging portion 25 has a greater moving space and the lance portion 30 is more firmly installed in a plane parallel to the elastically moving direction of the elastic engaging portion 25.

FIGS. 29, 30, 31 and 32 show a tenth embodiment of the contact 23, wherein the elastic engaging portion 25 and a lance plate 30a respectively integrally upward extend from the lance portion 30 of the contact 23. The lance plate 30a is installed in an elongated insertion channel 56 beside the first insertion space 50, whereby the contact 23 can be more firmly installed in the housing 21. In addition, the moving space of the elastic engaging portion 25 in the first insertion hole 50 is increased.

Figure 33:
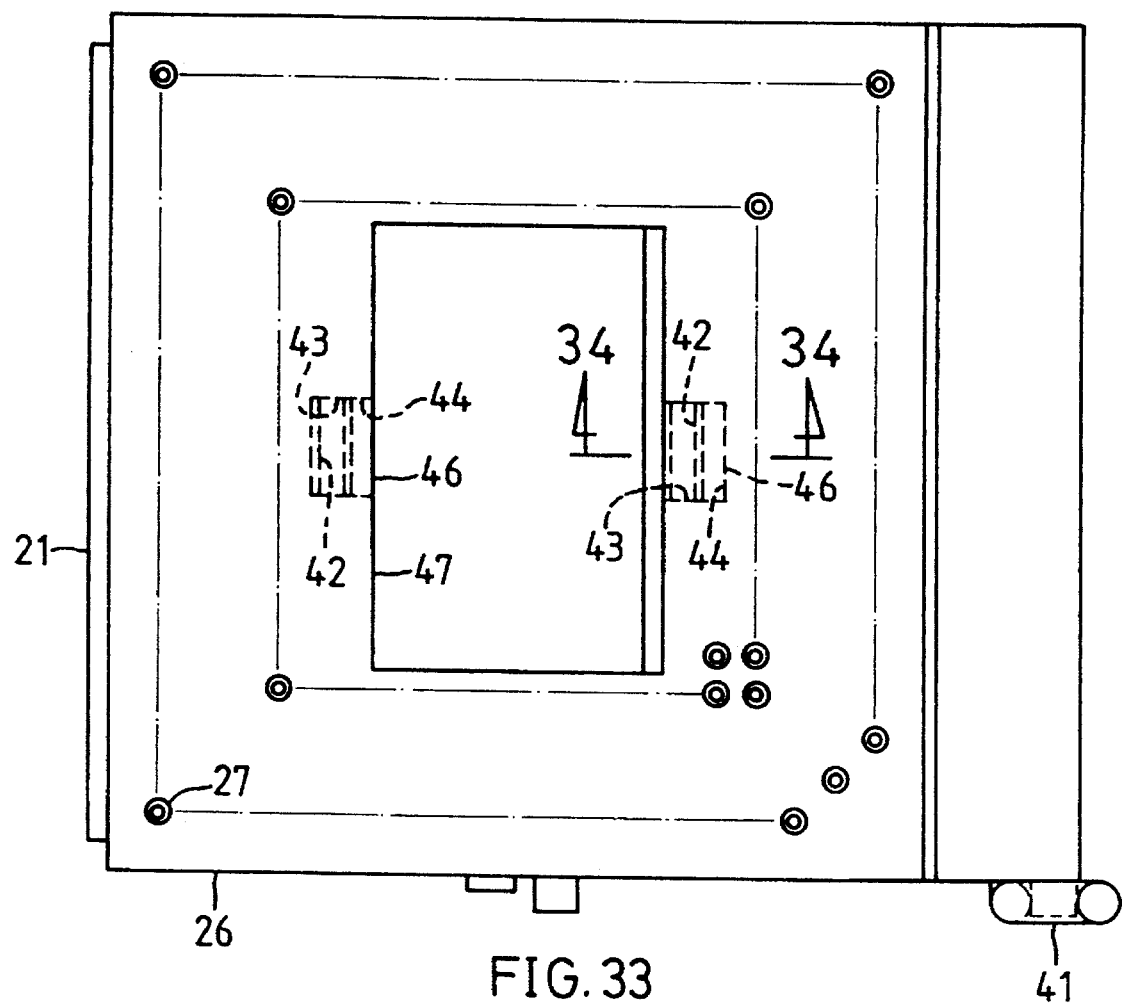
FIG. 33 is a top view showing that two additional leaf springs are disposed between the housing and the movable plate.
Figure 34:
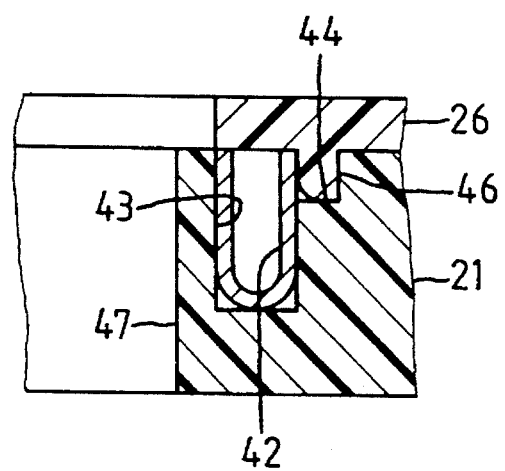

Please refer to FIGS. 33 and 34. In order to accurately align the through holes 27 of the movable plate 26 with the second insertion spaces 60 of the housing 21 when the movable plate 26 is located at the released position thereof so as to smoothly and easily insert the terminals A of the integrated circuit B into the second insertion spaces 60 or withdraw the terminals A therefrom, two U-shaped leaf springs 42 are disposed between the housing 21 and the movable plate 26. As shown in FIGS. 33 and 34, two installation holes 43 are respectively disposed on a front side and a back side of an upper recess 47 of the housing 21 for receiving the two leaf springs 42. In addition, two pits 44 are formed beside the two installation holes 43 respectively and two projections 46 are integrally disposed on a lower surface of the movable plate 26 and downward extend therefrom into the two pits 44 of the housing 21 respectively. Accordingly, when the movable plate 26 is moved left, the two projections 46 thereof will press and deform the two leaf springs 42. When the operation lever 41 is unlocked from the locked position 41b as shown in FIG. 2, not only the elastic engaging portions 25 of the multiple contacts 23 will elastically bound the terminals A rightward but also the leaf springs 42 will cooperatively push the projections 46 and bound the movable plate 26 rightward along the surface of the housing 21 to the released position. At this time, the through holes 27 of the movable plate 26 are right aligned with the second insertion spaces 60 of the housing 21, permitting the terminals A to be smoothly inserted thereinto or withdrawn therefrom.

Figure 35:
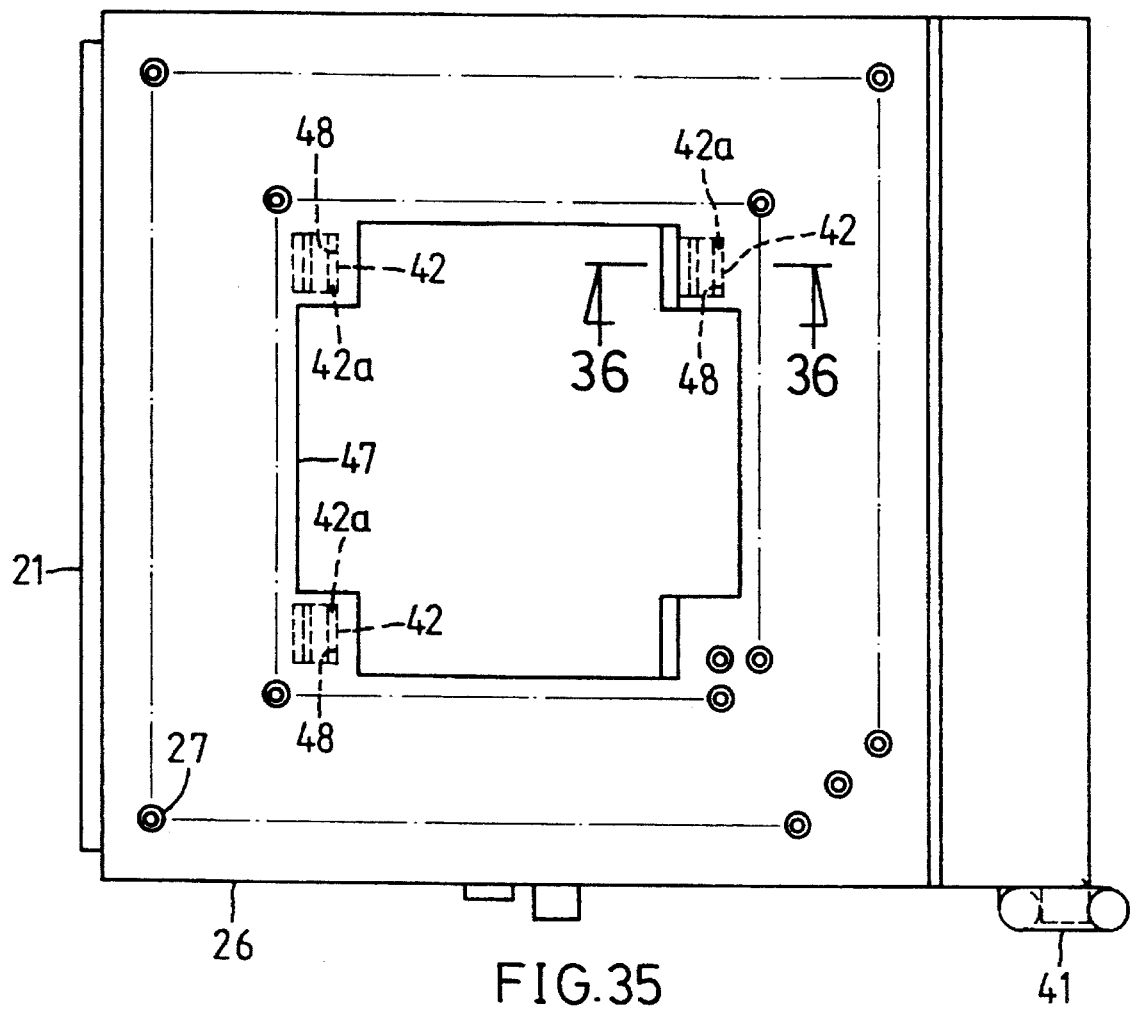
FIG. 35 is a top view of another embodiment, showing that three additional leaf springs are disposed between the housing and movable plate.
Figure 36:
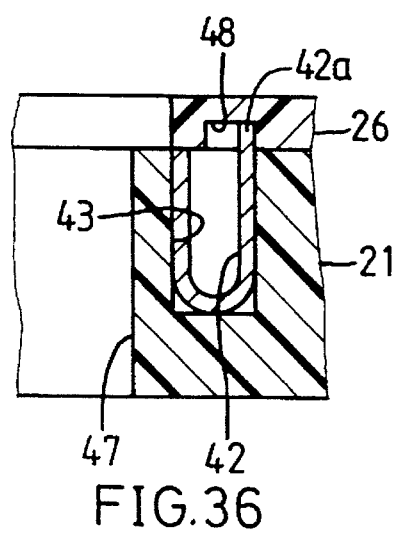
FIG. 36 is a sectional view taken along line 36—36 of FIG. 35, showing that the leaf springs bound the movable plate rightward to a completely released position.

FIGS. 35 and 36 show another embodiment which is different from the embodiment shown in FIGS. 33 and 34 in that the embodiment of FIGS. 35 and 36 has three leaf springs 42 disposed at three corners of the recess 47 and each having a protruding end 42a. In addition, three pits 48 are formed on the lower surface of the movable plate 26, whereby the protruding ends 42a of the leaf springs 42 can extend into the pits 48 respectively, enabling the movable plate 26 to push the three leaf springs 42.

Figure 37:
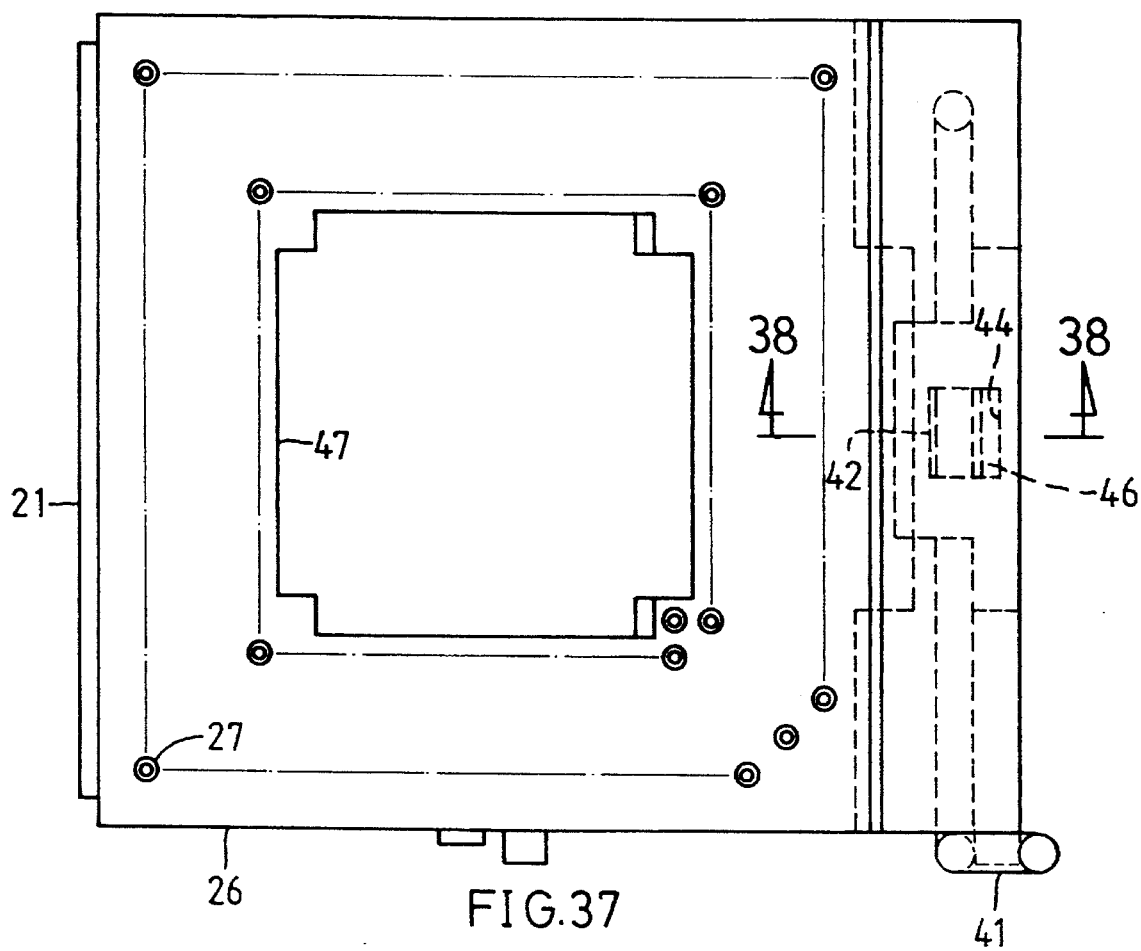
FIG. 37 is a top view of a still another embodiment, showing that one additional leaf spring is disposed between the housing and the movable plate on a right side thereof.
Figure 38:
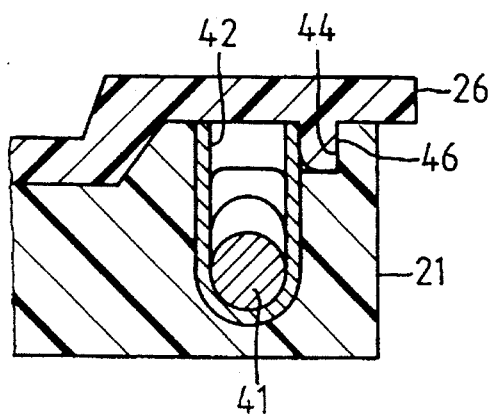
FIG. 38 is a sectional view taken along line 38—38 of FIG. 37, showing that the leaf spring bounds the movable plate rightward to a completely released position.

FIGS. 37 and 38 show still another embodiment which is different from the embodiment shown in FIGS. 33 and 34 in that the embodiment of FIGS. 37 and 38 has only one leaf spring 42 which is disposed at a position where the operation lever 41 is pivotally connected with the housing 21 of the socket 20.

A common point of the above embodiments shown in the drawings resides in that the free ends of the elastic engaging portions 25 are all disposed with stopping portions 31, 32 which are stopped by the first and second locating walls 54, 55 of the first insertion spaces 50 so as to accurately locate the elastic engaging portions 25 at their true positions. In addition, the elastic engaging portions 25 are pre-loaded by the locating walls 54, 55 before contacting with the terminals A. Therefore, once the terminals A are inserted into the insertion holes 22 and contact with the elastic engaging portions 25, the elastic engaging portions 25 will exert a greater (more sufficient) contacting pressure on the terminals A to achieve a better and more reliable contact relationship therebetween.

In conclusion, the advantages of the present invention are as follows:

1. The insertion holes 22 of the housing 21 can accurately locate the elastic engaging portions 25 of the contacts 23 so that the terminals A can be always easily and smoothly inserted into the insertion holes 22 of the housing 21.

2. Before the contacts 23 are inserted into the insertion holes 22, the normal width D between elastic engaging portions 25 of the contacts 23 and the insertion legs 24 thereof is larger than the length L of the first insertion spaces 50. Therefore, once the contacts 23 are inserted into the first insertion spaces 50, the elastic engaging portions 25 are pre-loaded. Accordingly, once the terminals A are inserted into the second insertion spaces 60 and contact with the elastic engaging portions 25, the elastic engaging portions 25 will exert a greater elastic force on the terminals A to achieve a better contacting effect.

3. Each pitch of blank strip is used to produce one contact 23. Therefore, half of the material for manufacturing the contacts 23 is saved.

4. The contacts 23 are manufactured at a pitch equal to that of the insertion holes 22 of the housing 21, so that each row of contacts 23 can be installed into a row of insertion holes 22 at one time. Therefore, the installation procedure is simplified and the production efficiency is doubled.

5. The improved socket 20 includes additional leaf springs 42 which are disposed between the housing 21 and the movable plate 26. Therefore, when the operation lever 41 is unlocked from the locked position 41b as shown in FIG. 2, not only the elastic engaging portions 25 of the multiple contacts 23 will elastically bound the terminals A rightward but also the leaf springs 42 will cooperatively push the projections 46 and bound the movable plate 26 rightward along the surface of the housing 21 to the released position. At this time, the through holes 27 of the movable plate 26 are right aligned with the second insertion spaces 60 of the housing 21, permitting the terminals A to be smoothly inserted thereinto or withdrawn therefrom.

The above embodiments are only used to illustrate the present invention and not intended to limit the scope of the present invention. Any derivation and modification from these embodiments should fall within the scope of the present invention as defined by the appended claims.

What is claimed is:

1. A zero insertion force socket comprising:

a socket housing having multiple insertion holes, each of said insertion holes including:

a first insertion space having a front wall, first and second locating walls lying on a common plane opposite to said front wall and separated from each other, a first side wall one side of which adjoins one side of said front wall and the other side of which adjoins one side of said first locating wall, and a second side wall one side of which adjoins the other side of said front wall and the other side of which adjoins one side of said second locating wall; and a second insertion space adjacent to and communicating with said first insertion space through an opening defined between said first and second locating walls, said second insertion space having a back wall opposite to said front wall, a third side wall one side of which adjoins the other side of said first locating wall while the other side of which adjoins one side of said back wall, and fourth side wall one side of which adjoins the other side of said second locating wall while the other side of which adjoins the other side of said back wall;

a movable plate having multiple through holes corresponding to said insertion holes of said housing respectively, said movable plate being disposed over said housing and slidable along a surface of said housing in specified directions between a released position and a locked position by a lever means; and multiple contacts installed in said insertion holes of said housing respectively, each of said contacts including an insertion leg and an elastic engaging portion extending from said insertion leg, on two sides of a free end of said elastic engaging portion being formed two stopping portions, a width of said elastic engaging portion at said stopping portions being larger than a width of said opening while smaller than a distance between said first and second side walls, whereby said two stopping portions are adapted to abut against said first and second locating walls respectively and in a free state, a normal distance between said free end of said elastic engaging portion and said insertion leg is larger than a distance between said front wall of said first insertion space and said locating walls so that after said contact is inserted into said first insertion space, said elastic engaging portion is biased against as well as pre-loaded and accurately located by said first and second locating walls of said first insertion space so as to accurately exert a sufficient contacting pressure on a contact terminal of a device inserted in said second insertion space and moved toward said first insertion space when the device is positioned on the socket and moved by said lever means.

2. A zero insertion force socket as claimed in claim 1, wherein said elastic engaging portion of said contact integrally extends from an upper end portion of said insertion leg of said contact.

3. A zero insertion force socket as claimed in claim 1 or 2, wherein said contact further includes a lance portion which extends from said insertion leg of said contact in order to facilitate installation of said contact in said insertion hole.

4. A zero insertion force socket as claimed in claim 1 or 2, wherein said movable plate further includes multiple pushing portions which extend downward from said movable plate into said insertion holes of said housing and abut against one side of said terminal so as to move along with said terminal toward said elastic engaging portion of said contact and support said contact terminal against the contacting pressure exerted by said elastic engaging portion on the other side opposite said one side of said terminal.

* * * * *